United States Patent [19]

Bogert

[11] 3,934,205

[45] Jan. 20, 1976

[54] FREQUENCY LOCK LOOP EMPLOYING A GATED FREQUENCY DIFFERENCE DETECTOR HAVING POSITIVE, ZERO AND NEGATIVE THRESHOLD DETECTORS

[75] Inventor: Warren D. Bogert, Fort Lee, N.J.

[73] Assignee: International Telephone and Telegraph Corporation, Nutley, N.J.

[22] Filed: Jan. 27, 1975

[21] Appl. No.: 544,425

[52] U.S. Cl. .................. 325/346; 325/420; 325/423
[51] Int. Cl.² .......................................... H04B 1/16
[58] Field of Search ............ 325/60, 341, 346, 349, 325/419–423; 178/5.8 AF; 329/105, 112, 122, 126, 140, 146; 331/10–12, 17, 18, 25; 358/23, 25

[56] References Cited
UNITED STATES PATENTS

| | | | |
|---|---|---|---|
| 3,403,355 | 9/1968 | Takada | 331/12 |
| 3,646,446 | 2/1972 | Rittenbach | 325/346 |
| 3,667,050 | 5/1972 | Gibson | 325/420 |
| 3,673,321 | 6/1972 | Janssen | 325/420 |
| 3,701,948 | 10/1972 | McAuliffe | 325/60 |
| 3,863,156 | 1/1975 | Bogert | 325/346 |

Primary Examiner—Howard W. Britton
Assistant Examiner—Jin F. Ng
Attorney, Agent, or Firm—John T. O'Halloran; Menotti J. Lombardi, Jr.; Vincent Ingrassia

[57] ABSTRACT

This invention relates to a gated frequency difference detector for use in a frequency lock loop. The gated frequency difference detector consists of a dual output hybrid quadrature mixer, two parallel video signal processing channels, a digital phase/frequency detector, a digital scaler and a digital-to-analog converter. The difference in frequency between the RF input and the output of a local oscillator is measured. Two orthogonal frequency difference outputs are first generated, one of which either leads or lags the other depending on the sense of the difference. Signals are then bandwidth limited and amplified in two video channels and converted to logic levels. The phase and frequency are finally digitally detected and processed to generate a bipolar voltage proportional to the magnitude and sense of the frequency difference.

The digital detection and processing apparatus includes in each channel a positive, zero, and negative threshold detector, the outputs of which are converted to a four-bit binary code.

6 Claims, 11 Drawing Figures

Fig. 3a. CHANNEL ① THRESHOLD DETECTION 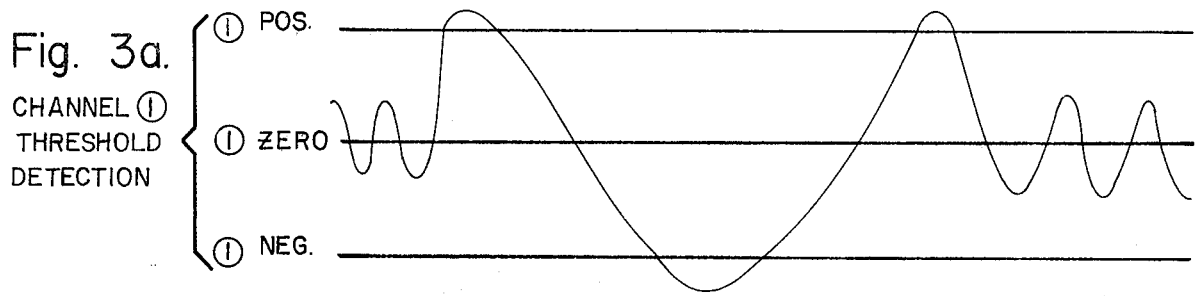
Fig. 3b. CHANNEL ② THRESHOLD DETECTION 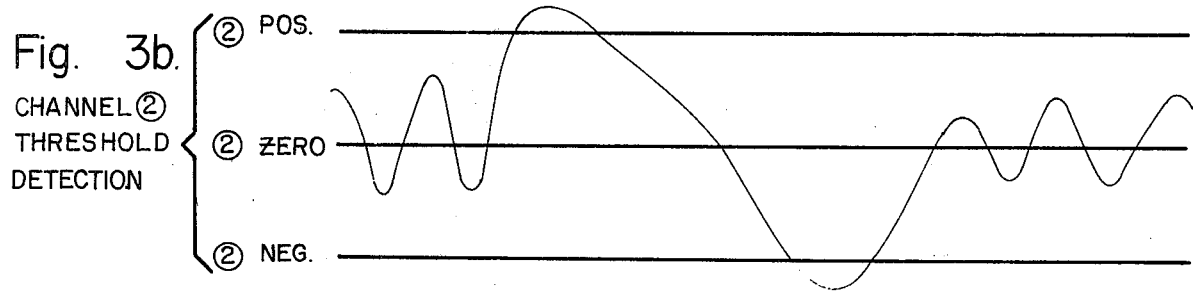
Fig. 3c. CHANNEL ① 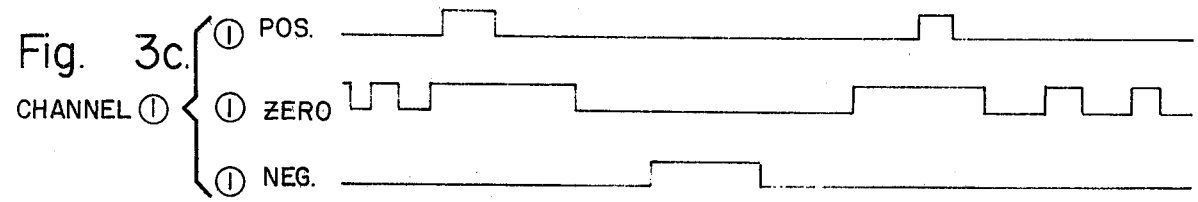
Fig. 3d. CHANNEL ② 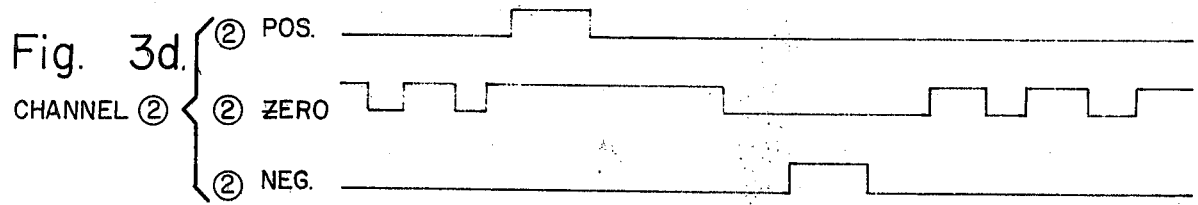
Fig. 3e. MOD① POS 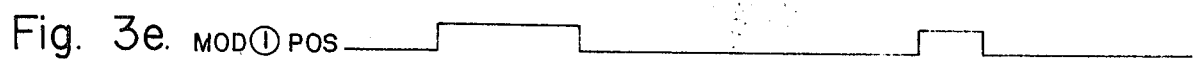
Fig. 3f. MOD① NEG 
Fig. 3g. MOD② POS 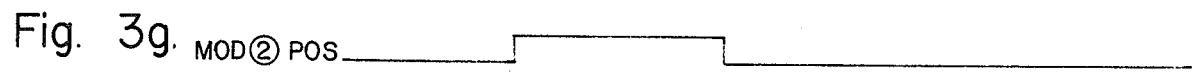
Fig. 3h. MOD② NEG 
DECODE   0000 | 1000 | 1010 | 0010 | 0110 | 0100 | 0101 | 0001 | 1001 | 0000

FREQUENCY LOCK LOOP EMPLOYING A GATED FREQUENCY DIFFERENCE DETECTOR HAVING POSITIVE, ZERO AND NEGATIVE THRESHOLD DETECTORS

CROSS-REFERENCE TO RELATED APPLICATION

This is related to application Ser. No. 342,121 filed Mar. 21, 1973 now U.S. Pat. No. 3,863,156, entitled "Frequency Lock Loop Employing A Gated Frequency Difference Detector" by the same inventor and assigned to the assignee of the present invention, which related application is hereby incorporated by reference.

BACKGROUND OF THE INVENTION

This invention relates to a frequency lock loop circuit employing a gated frequency difference detector.

It has been found that the well-known phase lock loop circuit requires a limiter to maintain the loop gain constant. The phase detector output is the product of both the input amplitude and the sine of the phase angle. The above-mentioned limiter maintains the input amplitude constant for varying input RF levels and in this way keeps the loop gain constant. This limiter is usually very costly and physically very large.

A system which avoids the use of the above mentioned limiter is described in the above identified related U.S. Pat. No. 3,863,156. This apparatus requires the use of four detection levels, a positive and negative level for each of a pair of quadrature video signals. This apparatus suffers from the disadvantages that the thresholds must be near the zero crossings of the sine wave in order to develop the decoded outputs to operate the phase detector. Further, the thresholds must have a value greater than the peak noise value to prevent false triggering.

SUMMARY OF THE INVENTION

It is an object of the present invention to provide a frequency lock loop circuit which eliminates the need for an RF limiter and allows a greater flexibility of threshold settings, while substantially reducing the possibility of false triggering.

According to a broad aspect of the invention, there is provided a gated frequency detector for a frequency lock loop circuit comprising: a first source of a pulsed input signal; a second source of a variable frequency reference signal; first means coupled to said first and second source for generating first and second phase quadrature frequency difference outputs; means coupled to said first and second outputs for detecting the frequency difference between said first and second sources, said detecting means comprising: a first threshold detector having first and second outputs, said first output being a logical pulse output which becomes high when said first phase quadrature frequency difference output is above a first predetermined threshold and remains high until said first difference output becomes zero, and said second output being a logical pulse output which becomes high when said first phase quadrature frequency difference output is below a second predetermined threshold and remains high until said second difference output becomes zero; a second threshold detector having first and second outputs, said first output being a logical pulse output which becomes high when said second phase quadrature frequency difference output is above said threshold and remains high until said second difference output becomes zero, and said second output is a logical pulse output which is high when said second phase quadrature frequency difference output is below said second threshold and remains high until said second difference output becomes zero; a digital phase frequency detector coupled to the output of said first and second threshold detectors for generating a first pulsed signal during the duration of said input pulse which corresponds to said frequency difference and a second signal which corresponds to the sense of said frequency difference; counting means coupled to said first pulsed signal for counting the number of pulses; second means coupled to said means for detecting for generating a DC voltage porportional to said frequency difference, said DC voltage applied to said second source for varying the output of said second source; and a third source of a control gate pulse having an output coupled to said second means and synchronous with said first source for enabling and resetting the operation of said second means.

The above and other objects of the present invention will be more clearly understood from the following detailed description taken in conjunction with the accompanying drawings in which:

BRIEF DESCRIPTION OF THE DRAWINGS

FIGS. 3a through 3h are curves illustrating the video and digital processing steps carried out in conjunction with the block diagram of FIG. 1 and a logic diagram of FIG. 2.

DESCRIPTION OF THE PREFERRED EMBODIMENT

Figure 1:
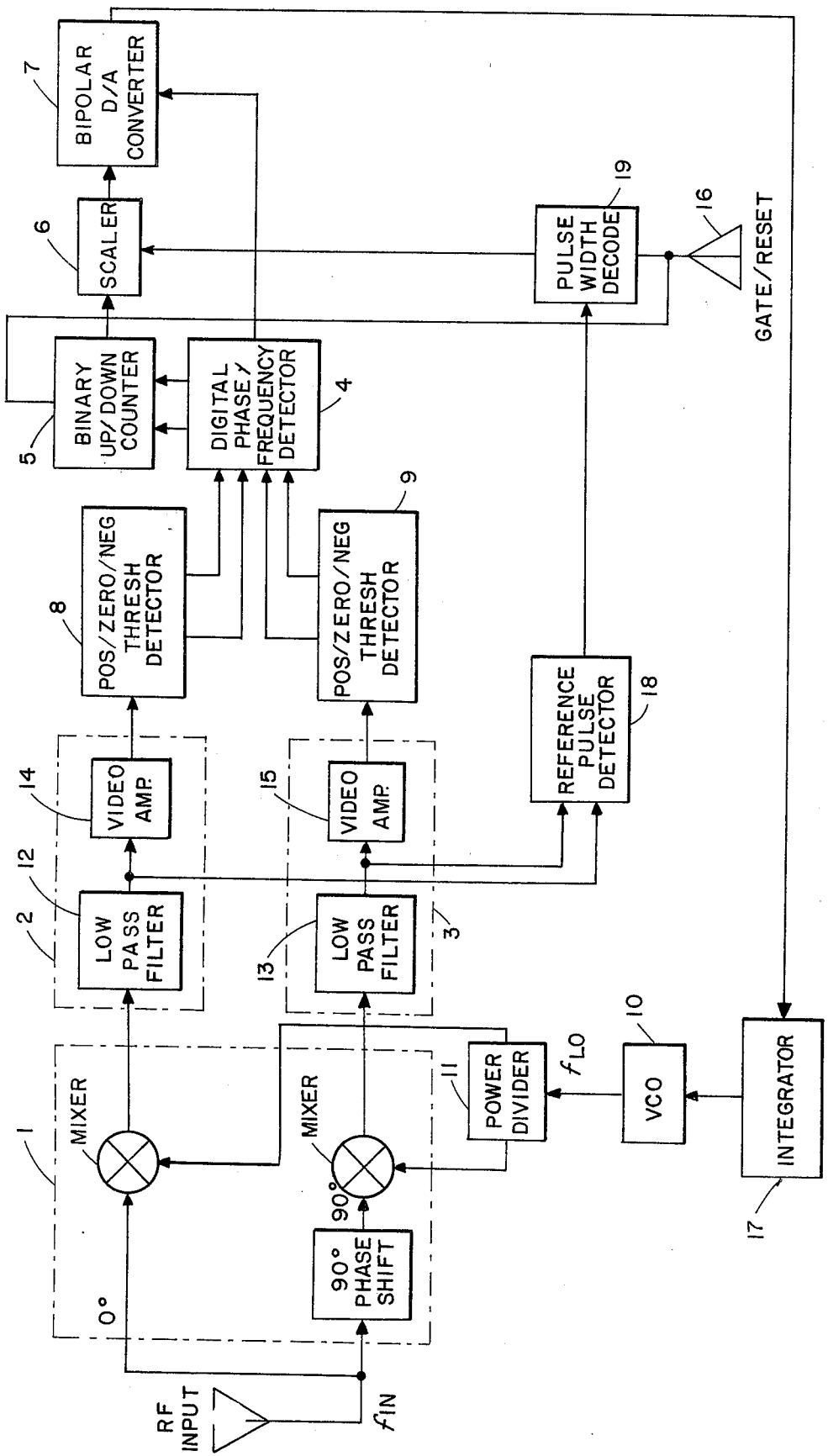
FIG. 1 is a functional block diagram of a frequency lock loop circuit employing a gated frequency difference detector according to the invention.

Referring to FIG. 1, the gated frequency difference detector consists of a dual output hybrid quadrature mixer 1, two parallel video signal processing channels 2 and 3, a combined positive/zero/negative threshold detector for each channel, denoted by numerals 8 and 9 respectively, a digital phase/frequency detector 4, and up/down counter 5, a scaler 6 and a digital-to-analog converter 7. A separate pulse detection circuit 18 operates in parallel with the video and digital phase/frequency processing channel from the two bandwidth limited outputs of the quadrature mixer and consists of combined positive/zero/negative threshold detectors similar to 8 and 9. The RF input consists of high frequency pulses, and a voltage control oscillator 10 supplies CW to power divider 11. The output of the frequency difference detector is a voltage proportional to the frequency difference during the RF pulses and of a polarity which is determined by the sense of the frequency difference.

Hybrid quadrature mixer 1 generates two orthogonal difference frequency outputs A and B, one of which is either leading or lagging the other depending on the sense of the frequency difference between RF input ($F_{IN}$) and the output voltage controlled oscillator 10 ($F_{LO}$). Outputs A and B are bandwidth limited in filters 12 and 13 which determine the system selectivity and interference rejection. The outputs of filters 12 and 13 are then amplified in video amplifiers 14 and 15. The outputs of video amplifiers 14 and 15 feed threshold detector 8 and threshold detector 9 respectively which are designed to supply outputs which are standard logic levels.

Each threshold detector detects a signal which is above a first predetermined threshold and below a second predetermined threshold. In the above identified related copending application, each threshold detector described therein supplies two inputs to digital phase/frequency detector 4 which correspond to that period of time during which the input to the threshold detector is either above a first predetermined threshold level or below a second predetermined threshold level. In the instant case, each threshold detector is further provided with a zero volt level threshold detector which detects all zero crossings from both the input signal and noise. The output of each zero level threshold detector (one for each channel) is processed with the positive and negative threshold outputs (one for each channel) whereby a modified series of positive and negative threshold outputs is provided having leading edges which start when the applied signal crosses the threshold and end when the applied signal crosses zero. Digital phase/frequency detector 4 detects the unique order of input logic combinations for a lead or lag condition represented by the outputs of threshold detectors 8 and 9.

The output of digital phase/frequency detector 4 is a pulse in real time for every half cycle of the frequency of the two inputs, each from one of the threshold detectors.

Digital phase/frequency detector 4 has three outputs. One output is applied to the up input of binary up/down counter 5 if a lead condition exists and a second is applied to the down input if a lag condition exists. A third output indicates a lead or lag condition. The output of binary up/down 5 is a parallel binary number and represents the total of 180° phase increments of lag or lead between the RF carrier input and the voltage control oscillator input over the duration of the RF carrier input pulse. Since two 180° increments make a cycle, this number can also be expressed as the product of twice the average frequency difference times the pulse width, $2\Delta f\tau$. The parallel output of counter 5 is applied to a digital scaling circuit 6 where it is scaled by a term proportional to the inverse of the RF carrier pulse width $\tau$. This cancels the pulse width term of the counter output expression leaving only the $2\Delta f$ term.

The count in the counter is held until just before the receipt of the next RF pulse, at which time it is reset via the leading edge of the gate reset pulse on line 16.

The reset pulses are derived using a predictive process similar to range gating from the input RF pulses. However, this does not represent a part of the invention, and a further discussion is not deemed necessary. This eliminates detection of all pulses not synchronous with the gate reset pulse.

The output of scaler 6 is, in effect, a sample and hold measurement of the frequency difference. The scaling is accomplished by digitally shifting the binary point in steps to cover the width of the RF input pulses.

Shifting may be accomplished by applying the outputs of counter 5 to a plurality of serially cascaded 4-line to 1-line data selectors of the type manufactured by Texas Instruments, Inc. bearing Part Nos. SN54153 and SN74153. Each of the Texas Instruments circuits comprises two 4 to 1 data selectors containing data input terminals and terminals to which external control may be coupled. Under the control of pulse width decode 19, scaler 6 comprising the above identified devices has the capability of shifting the binary point of the output of counter 5 from 0 to 4 places, depending on the output of pulse width decode 19. This capability is completely provided for by the above identified Texas Instruments circuits.

The output of digital scaling circuit 6 is applied to a bipolar digital-to-analog converter 7 to generate a voltage which is the input to the analog loop integrator 17. The sense output of the digital phase/frequency detector controls the sense of the output of D/A converter 7 to make it either positive or negative.

Figure 2:
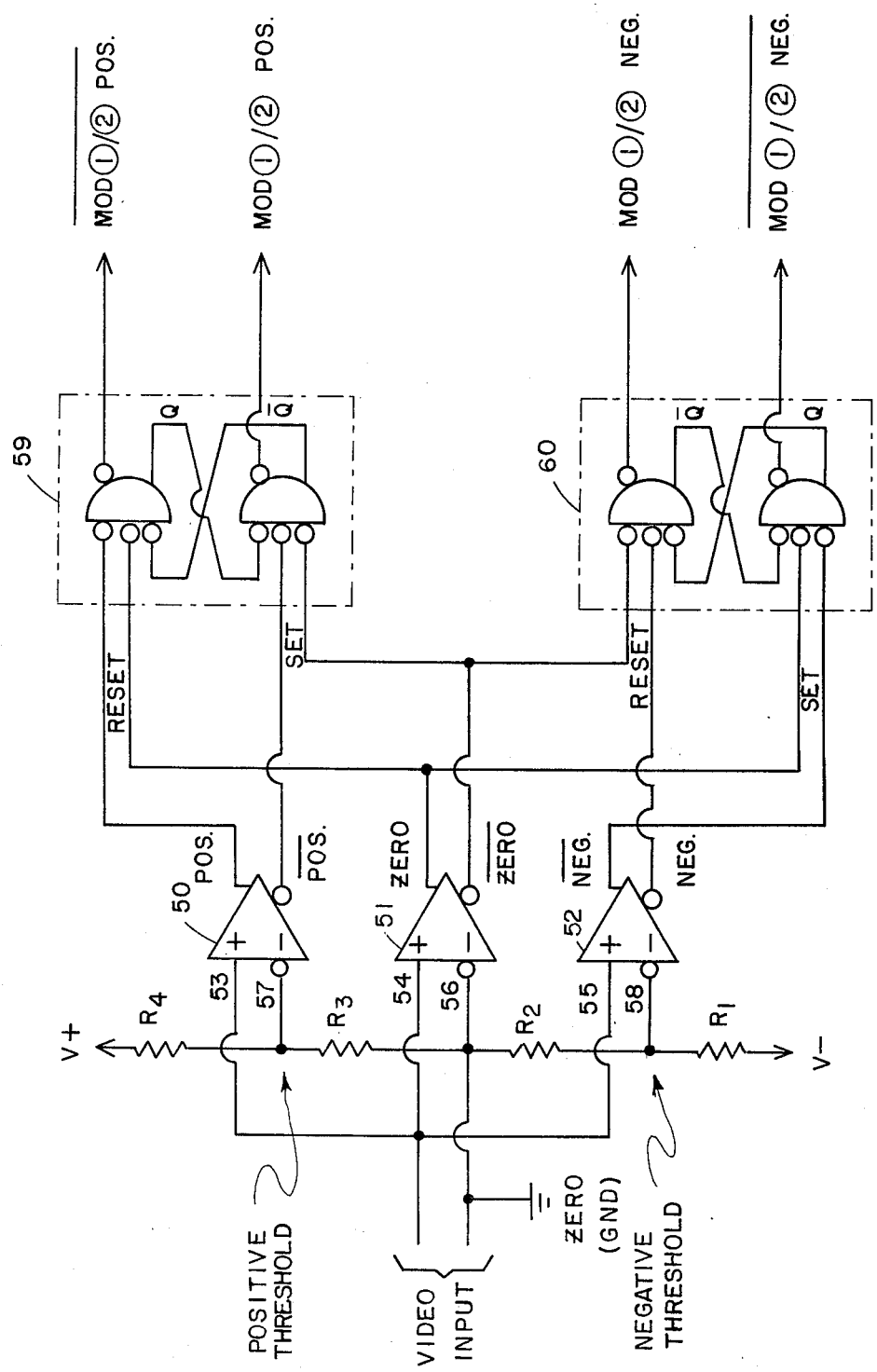
FIG. 2 shows a logic implementation of the threshold detectors in FIG. 1.

FIG. 2 illustrates one implementation of the positive/zero/negative threshold detector shown in FIG. 1. Since threshold detectors 8 and 9 are identical, only one is shown in FIG. 2. The threshold detector of FIG. 2 comprises three differential amplifiers 50, 51 and 52, each having two inputs and two outputs. A first input of each differential amplifier is coupled to the output of video amplifier 14 or 15 at terminals 53, 54 and 55. The second input 56 of differential amplifier 51 is coupled to ground, differential amplifier 51 corresponding to the zero voltage threshold detector. The second input 57 of differential amplifier 50, the positive threshold detector, is connected to the junction of a voltage divider comprising resistors R3 and R4, said voltage divider being coupled between ground and a source of positive voltage V+. The second input 58 of differential amplifier 52, the negative threshold detector, is coupled to the junction of a voltage divider comprising resistors R1 and R2, which voltage divider is coupled between ground and a source of negative voltage V−. Threshold levels are set by the proper selection of resistors R1, R2, R3 and R4 and voltage sources V+ and voltage V−. As stated previously, each of the differential amplifiers has first and second outputs, the first output being merely an inversion of the second output. The outputs of the differential amplifiers are applied to flip-flops 59 and 60 in such a way that flip-flop 59 will set when the input signal is above the positive threshold and will reset when the input signal crosses zero voltage. Flip-flop 60 will set when the input signal passes the negative threshold and will reset when the input signal crosses the zero voltage point. It should be noted that many alternative implementations can be easily found.

FIGS. 3a and 3b illustrate the video and digital processing steps of two orthogonal signals, one of which is applied to threshold detector 8 in channel 1, and the second of which is applied to threshold detector 9 in channel 2. It can be seen from FIGS. 3a and 3b that the two orthogonal signals from IF quadrature mixer 1 contain both pulses which exceed the established thresholds and noise. FIGS. 3c and 3d illustrate the digital signals produced by the theshold detectors (positive, zero and negative) in channel 1 (FIG. 3c) and channel 2 (FIG. 3d). Finally, FIGS. 3e, 3f, 3g and 3h illustrate the outputs of the threshold detector flip-flops, two of which are shown in FIG. 2, from which the modified 4-bit binary codes are produced and applied to digital phase/frequency detector 4.

Figure 4:
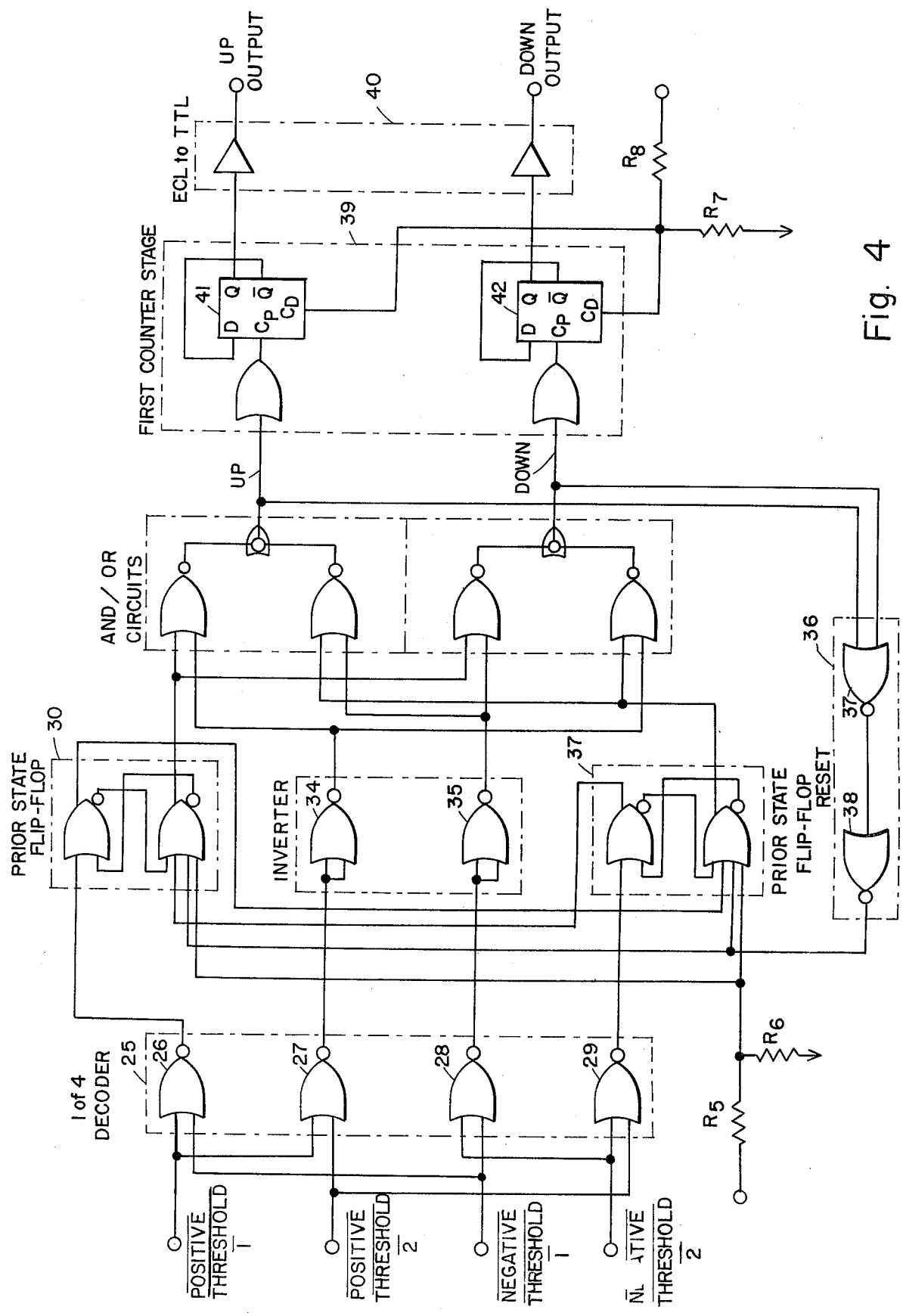
FIG. 4 is a logic diagram of the digital phase/frequency detector of FIG. 1.

Digital phase/frequency detector 4 operates from the logic level outputs of each of the threshold detector flip-flops. One implementation of a digital phase/frequency detector is shown in FIG. 4. It consists of a one of four decoder 25 comprising gates 26, 27, 28 and 29 to decode the four different combinations of inputs, two prior state memory flip-flops 30 and 31, two AND-/OR circuits 32 and 33 to generate the up output or the down output, inverters 34 and 35, and reset unit 36 comprising gates 37 and 38, which generates a reset signal for the prior state flip-flops after an "up" or "down" signal has been generated. Block 39 in FIG. 4 represents the first stage of counter 5 comprised of emitter-coupled logic, and block 40 represents an emitter-coupled logic (ECL) to transistor-transistor logic (TTL) converter, to which the outputs of flip-flops 41 and 42 are coupled. Converter 40 would be necessary if the remaining stages of counter 5 are comprised of TTL logic. The input combination code of the four threshold detector flip-flop outputs, as shown in FIG. 3, is sorted by the decoder into one or none of the four outputs.

For the idealized case, i.e., a case in which (1) the differential delays in all of the video signal processing up to the decoder output of the phase detector is zero and (2) the decoder output pulse needed to operate the phase detector is infinitesimally small, the thresholds can be set at 90°, peak of the sine wave, when using the inventive arrangement as opposed to below the 45° points of the sine wave if only positive and negative threshold detectors are employed without a zero voltage detector. The improvement for the two idealized cases of the inventive arrangement over the arrangement described in the above identified related application is the ratio of the value of the sine at 90° and 45°, which is 1.41 or 3dB. This is the minimum improvement. For the real case in which there exist differential delays and minimum decoder pulse widths, the improvement is greater because the slope of the sine wave is much lower at its peak than near its zero crossing. The arrangement described in the related application contemplates a threshold of 20dB below the peak of the sine wave (the 6° level of the sine wave). This corresponds to a delay allowance of 45° minus 6° or 39°. The threshold in the inventive six comparator arrangement is 90° minus 39° or 51° for the same delay allowance.

The improvement over the four comparator method is the ratio of the sine 51° to the sine 6° which is .78/.1 = 7.8 or 17.8dB. As the Search Lock Oscillator (SLO) frequency difference decreases, the period of the difference frequency becomes longer and the condition for the real case approach that of the idealized case.

Another way to state the comparative improvement is by change of sensitivity with SLO frequency difference. At zero frequency difference the six comparator method is 0dB (sine 90°/sine 90°), and the four comparator method is −3dB (sine 45°/sine 90°). At the maximum difference frequency of operation—the frequency at which the circuit delays are equivalent to 39°—the six comparator method sensitivity has dropped to only −2.2 dB (sine 51°/sine 90°) while the four comparator method sensitivity has dropped to −20dB (sine 6°/sine 90°).

It should be clear that the boxes shown in the block diagram of FIG. 1 are standard and are known elements and that their implementation is left to the choice of the designer.

While the principles of the invention have been described above in connection with specific apparatus, it is to be clearly understood that this description is made only by way of example and not as a limitation on the scope of the invention.

What is claimed is:

1. A gated frequency detector for a frequency lock loop circuit comprising:
   a first source of a pulsed input signal;
   a second source of a variable frequency reference signal;
   first means coupled to said first and second source for generating first and second phase quadrature frequency difference outputs;
   means coupled to said first and second outputs for detecting the frequency difference between said first and second sources, said detecting means comprising:
   a first threshold detector having first and second outputs, said first output being a logical pulse output which becomes high when said first phase quadrature frequency difference output is above a first predetermined threshold and remains high until said first difference output becomes zero, and said second output being a logical pulse output which becomes high when said first phase quadrature frequency difference output is below a second predetermined threshold and remains high until said second difference output becomes zero;
   a second threshold detector having first and second outputs, said first output being a logical pulse output which becomes high when said second phase quadrature frequency difference output is above said first threshold and remains high until said second difference output becomes zero, and said second output is a logical pulse output which is high when said second phase quadrature frequency difference output is below said second threshold and remains high until said difference output becomes zero;
   a digital phase frequency detector coupled to the output of said first and second threshold detectors for generating a first pulsed signal during the duration of said input pulse which corresponds to said frequency difference and a second signal which corresponds to the sense of said frequency difference;
   counting means coupled to said first pulsed signal for counting the number of pulses;
   second means coupled to said means for detecting for generating a DC voltage proportional to said frequency difference, said DC voltage applied to said second source for varying the output of said second source; and
   a third source of a control gate pulse having an output coupled to said second means and synchronous with said first source for enabling and resetting the operation of said second means.

2. A gated frequency detector according to claim 1 wherein said first means includes:
   a 90° phase shifter coupled to said first source;
   a first mixer having inputs coupled to said first source and said second source and generating at its output said first phase quadrature difference frequency output; and
   a second mixer having inputs coupled to said second source and the output of said 90° phase shifter for generating at its output said second phase quadrature frequency difference output.

3. A gated frequency detector according to claim 2 wherein said second source includes:
   an integrator having as its input said DC voltage; and a voltage control oscillator coupled to the output of said integrator.

4. A gated frequency detector according to claim 3 further including:
a first low pass filter coupled to said first phase quadrature signal; and
a first video amplifier coupled to the output of said first low pass filter.

5. A gated frequency detector according to claim 4 further including:
a second low pass filter coupled to said second phase quadrature output; and
a second video amplifier coupled to the output of said second low pass filter.

6. A gated frequency detector according to claim 5 further including:
a pulse width decoder for measuring the width of the input pulse; and
a scaler coupled to the output of said pulse width decoder and said binary counter for scaling the output of said binary counter by a term proportional to the inverse of the input pulse width.

* * * * *